United States Patent [19]

Krzyzanowski

[11] Patent Number: 5,180,933
[45] Date of Patent: Jan. 19, 1993

[54] PROGRAMMABLE DIGITAL OUT-OF-LOCK DETECTOR

[75] Inventor: Robert V. Krzyzanowski, Plano, Tex.
[73] Assignee: Honeywell Inc., Minneapolis, Minn.
[21] Appl. No.: 798,470
[22] Filed: Nov. 26, 1991
[51] Int. Cl.[5] .......................... H03K 9/06; H03K 5/26
[52] U.S. Cl. ................................ 307/514; 307/527; 328/110; 328/133; 331/DIG. 2
[58] Field of Search ....................... 307/514, 516, 527; 328/133, 134, 110; 331/DIG. 2

[56] References Cited

U.S. PATENT DOCUMENTS

| | | | |
|---|---|---|---|
| 4,354,124 | 10/1982 | Shima et al. | 307/514 |
| 4,675,558 | 6/1987 | Serrone et al. | 328/134 |
| 4,904,948 | 2/1990 | Asami | 307/479 |

Primary Examiner—Timothy P. Callahan
Attorney, Agent, or Firm—William D. Lanyi

[57] ABSTRACT

A out-of-lock detector is described which provides a first series of pulses that are compared to a data stream of pulses. Second and third series of pulses are also created by the present invention. These lead and lag pulses are provided to represent particular logical relationships between the data stream and a clock signal. The sequential relationship between the lead pulses and the lag pulses are compared to determine whether or not the clock pulses and the data pulses are in a phase lock condition or, alternatively, are in an out-of-lock condition. A sequence comparator provides a logically low output pulse if an out-of-lock event is detected. A counter compares the number of out-of-lock events which occur in a predetermined period of time to a preset and programmable value. If an out-of-lock condition is detected, some external means for providing corrective action can then be implemented to bring the phase locked loop into a condition where it can again achieve a locked state. Both the value of the counter modulo N and the value of the predetermined period of time during which out-of-lock conditions are counted are programmable.

14 Claims, 5 Drawing Sheets

PROGRAMMABLE DIGITAL OUT-OF-LOCK DETECTOR

BACKGROUND OF THE INVENTION

1. Field of the Invention

The present invention generally relates to out-of-lock detectors and, more particularly, to an out-of-lock detector which provides an apparatus for detecting frequency deviations between a data signal and a clock signal of a predefined frequency and phase condition in a way which permits variable degrees of out-of-lock criteria to be programmed.

2. Description of the Prior Art

Many different types of phase locked loop arrangements are known to those skilled in the art and many types of out-of-lock detectors, for use in association with the phase locked loops, are also well known to those skilled in the art. The function of an out-of-lock detector is to determine if a series of clock pulses are of an appropriate frequency and phase condition for use by data interrogation circuitry. If an out-of-lock condition is detected, some external means for providing corrective action can then be implemented to bring the phase locked loop into a condition where it can again achieve a locked state. Many known devices utilize phase locked loops for these purposes.

Out-of-lock detectors normally apply a fixed criterion to the degree of phase or frequency deviation that will be tolerated by the system. This threshold procedure avoids the unnecessary corrective actions that may otherwise be caused in response to spurious or temporary deviations in frequency or phase relationships.

SUMMARY OF THE INVENTION

The present invention provides an apparatus for detecting frequency or phase deviations of a data stream from a predefined frequency and phase condition. A preferred embodiment of the present invention comprises a first means for providing a first series of pulses at a predefined frequency. Typically, the predefined frequency of the first series of pulses in chosen to either match or be a multiple of the expected frequency of the data pulses. The first providing means can be a clock or a voltage controlled oscillator in a preferred embodiment of the present invention.

The present invention also comprises a second means for providing a second series of pulses in which each of the second series of pulses is indicative of a first predefined relationship between each of the first series of pulses and a coincident pulse of the data signal. A third means for providing a third series of pulses is provided in a preferred embodiment of the present invention in which each of the third series of pulses is indicative of a second predefined relationship between each of the first series of pulses and a coincident pulse of the data signal.

The present invention also comprises a means for determining the sequential relationship between each one of the second series of pulses and a sequentially relared pulse of the third series of pulses. The second series of pulses represents lead pulses and the third series of pulses represents lag pulses in the preferred embodiment of the present invention. If the phase and frequency relationship between the data pulses and the first series of pulses is proper, each lead pulse is sequentially followed by a lag pulse. Therefore, the sequential relationship between each lead pulse of the second series of pulses can be compared to a sequentially associated lag pulse of the third series of pulses to determine whether each lead pulse is appropriately followed by a lag pulse. If the lead/lag relationship is deviated from, the present invention provides a signal pulse which is indicative of an out-of-lock event. These output signals are then counted over a predefined period of time to determine the degree of out-of-lock that exists between the pulses of the data signal and the pulses of the first series of pulses provided by the clock or voltage controlled oscillator.

The present invention provides an out-of-lock detector which can be implemented through the use of solid state techniques. This capability reduces the cost of the circuit and improves its speed of operation. Most alternative forms of out-of-lock detection systems perform their function through the use of analog integrating components to accumulate out-of-lock events. These types of techniques are susceptible to uncontrolled error sources and typically require nonintegratable components when implemented as an integrated circuit. The present invention circumvents these problems by using digital logic techniques throughout its circuit.

BRIEF DESCRIPTION OF THE DRAWINGS

The present invention will be more fully and completely understood from a reading of the Description of the Preferred Embodiment in association with the drawing, in which.

DESCRIPTION OF THE PREFERRED EMBODIMENT

Throughout the Description of the Preferred Embodiment, like components will be identified by like reference numerals.

Figure 1:
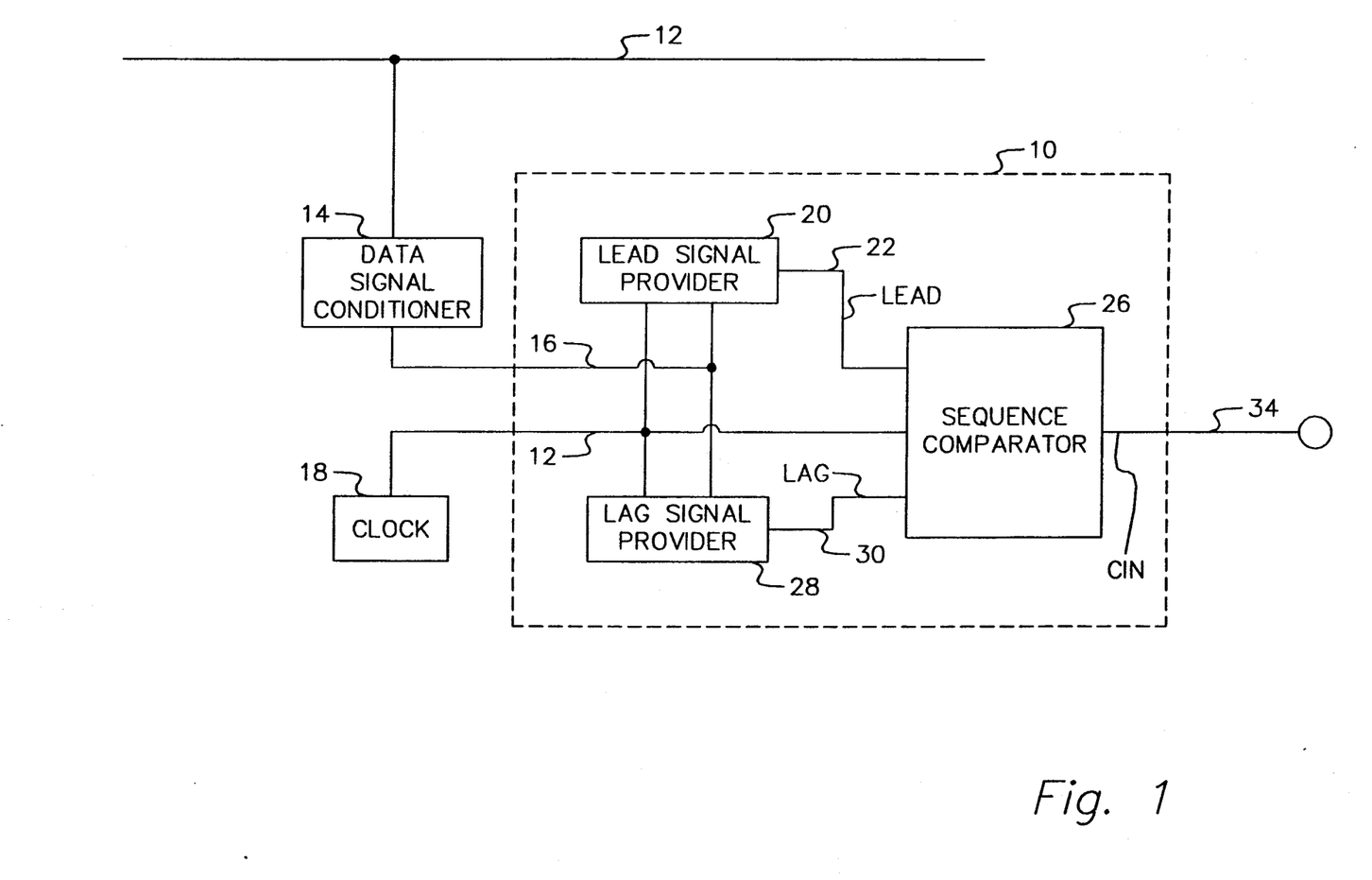
FIG. 1 illustrates a simplified schematic diagram of the present invention.

FIG. 1 illustrates the out-of-lock detector of the present invention, identified generally by reference numeral 10, associated with a source of a data signal and a clock. The present invention is particularly suitable for application in association with a signal line 12 over which a data stream is passed from one device to another. In a general situation, the sending apparatus and receiving apparatus can be connected with conventional electrical lines for purposes of transmitting the signal. Alternatively, the transmitter and receiver can be associated in signal communication with each other through the use of optical fibers over which light pulses are used to transmit signals. The medium over which the signals are transmitted is not directly related to a the operation of the present invention. Instead, an out-of-lock detector made in accordance with the provisions of the present invention can be used to detect deviations in the phase and frequency relationship between a signal and a predefined condition, whether the signal is transmitted over an electrical conductor or through an optical fiber.

If the signal, or data stream, on line 12 is a non-return to zero, or NRZ signal, a data signal conditioner 14 is used to provide a functionally related series of edge pulses, on line 16, to the present invention. In a preferred embodiment of the present invention, the data signal conditioner 14 creates a series of square wave pulses, or edge pulses, at a frequency which is the same as that of the baud rate of the data pulses on line 12, wherein each logic level change of the signal on line 12 causes a square wave pulse at a logic level of one and a predefined length to be provided on line 16. This concept will be described in greater detail below in conjunction with FIGS. 3 and 4. A clock 18 such as a voltage controlled oscillator, or VCO, provides a series of edge pulses at a frequency and phase condition which is expected to match that of the series of pulses received on line 16. The series of pulses on line 20 received from the clock 18 is a continuous alternating pattern of logical ones and zeros at a frequency and phase condition expected to match the pulses on line 16.

The present invention comprises a lead signal provider 20 which receives signals from both the data signal conditioner 14 and the clock 18. As will be described in greater detail below, the lead signal provider 20 produces a signal on line 22 which represents a first relationship between the two series of pulses received on lines 16 and 12. This second series of pulses, on line 22, is transmitted to a sequence comparator 26. A lag signal provider 28 also compares a relationship between the edge pulses on line 16 and the clock signals on line 12 to provide a third series of pulses, on line 30, to the sequence comparator 26.

In a most preferred embodiment of the present invention, the lead signals are generated and provided on line 22 when the signal on line 16 and the signal on line 12 are both at a logically high level. The lag signal, on line 30, is generated when the data signal on line 16 is at a logically high level and the clock signal on line 12 is at a logically low level. Because of the ways in which the lead signals on line 22 and the lag signals on line 30 are created, a proper frequency and phase lock condition between the signals on lines 16 and 12 will cause the lead and lag signals to be sequentially related in a predictable way. In other words, the lead signal on line 22 will always occur before a corresponding lag signal on line 30. If the sequential relationship between these two signals deviates from this expected condition by plus or minus 90 degrees, the phase sequence comparator 26 provides an output signal CIN on line 34 to indicate the occurrence of an out-of-lock event. As will be described in greater detail below, the logically low out-of-lock signals on line 34 can be counted over a predetermined period of time to determine the significance of the deviation of the data signals o line 16 from the phase and frequency of the clock signals on line 12.

Figure 2:
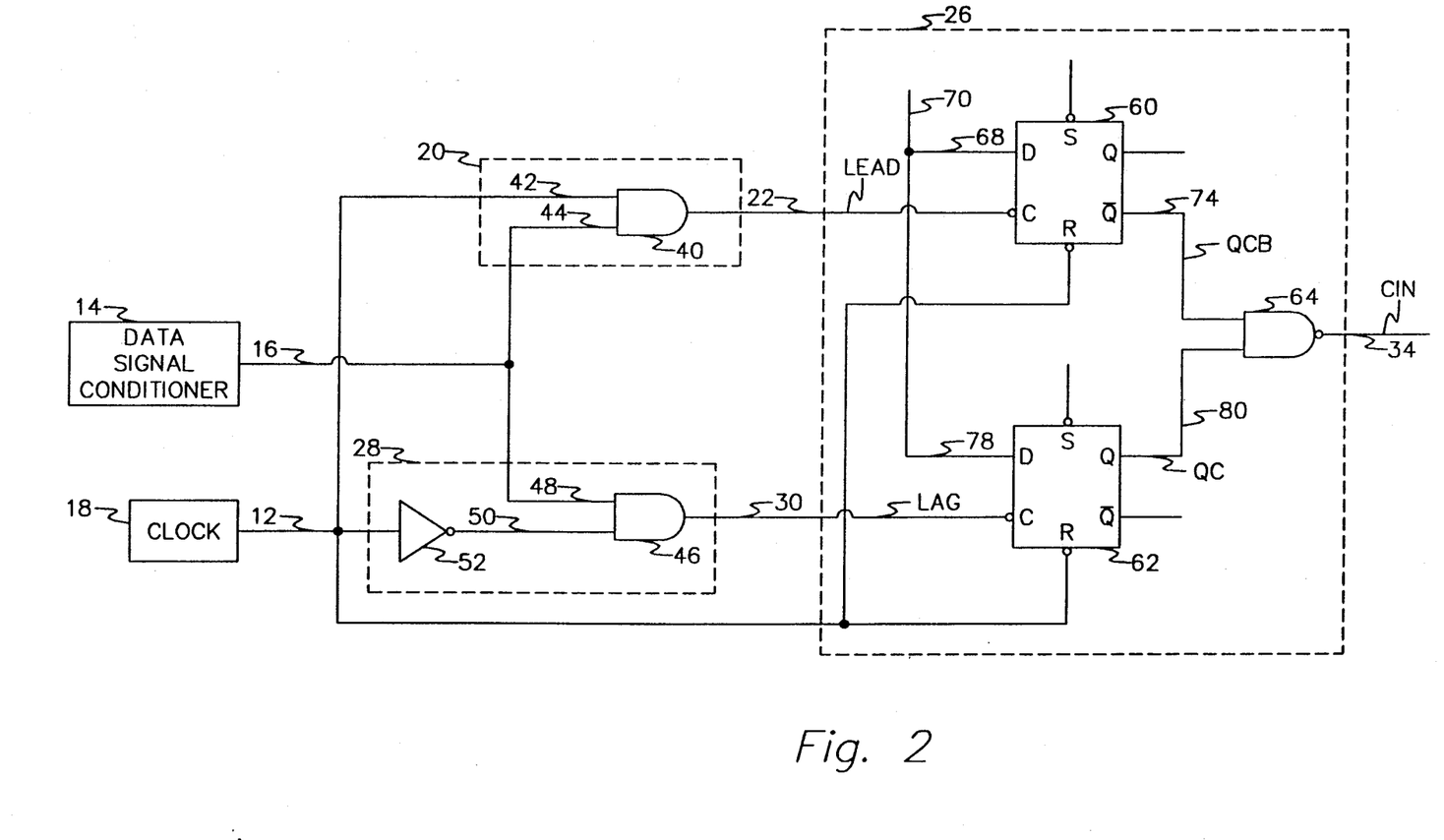
FIG. 2 shows a more detailed electrical schematic diagram of the out-of-lock detector of the present invention.

FIG. 2 illustrates a more detailed schematic representation of the circuitry of the present invention. As can be seen, the lead signal provider 20, or second means for providing a second series of pulses, comprises an AND gate 40 having two inputs. One input 42 of the AND gate 40 is connected to line 12 and the other input 44 is connected to line 16. Therefore, the lead signal that is provided as an output of the AND gate 40 on line 22 is logically high only when both the edge pulse signal on line 16 and the clock signal on line 12 are logically high.

The lag signal provider 28, in a most preferred embodiment of the present invention, comprises an AND gate 46 with two inputs. One of the inputs 48 is connected to line 16 to receive the edge pulses and the other input 50 is connected to an invertor 52 which inverts the clock pulses received on line 12. Therefore, the lag signal output provided on line 30 is logically high when the edge pulse signal on line 16 is logically high and the clock signal on line 12 is logically low. The lead signal is provided to the phase sequence comparator 26 on line 22, the lag signal is provided on line 30 and the clock signal, is provided on line 54. The phase sequence comparator 26 comprises a first flip-flop 60, a second flip-flop 62 and a NAND gate 64. The first flip-flop 60 has its data input connected to a source of a continuously logically high signal. This connection is illustrated in FIG. 2 by lines 68 and 70. Although line 70 is not particularly illustrated as being connected to any other component in FIG. 2, it should clearly be understood that line 70 is connected to any suitable and appropriate source of a continuously logically high signal and, furthermore, that the data input of the first flip-flop 60 is always connected to a logically high signal. The clock input of the first flip-flop 60 is connected to line 22 so that the clock input is responsive to the lead signals provided by the second providing means 20. It should also be noted that the clock of the first flip-flop 60 is bar output of the first flip-flop 60 is connected by line 7 to an input of NAND gate 64.

The second flip-flop 62 of the sequence comparator 26 has its data input connected by line 78 to line 70 which is a constant source of a logically high signal. In a manner similar to that described above in conjunction with the first flip-flop 60, the data input of the second flip-flop 62 is always connected to a continuously logically high signal. The clock input of the second flip-flop 62 is connected to line 30 and is responsive to the falling edge of the lag pulses. The Q output of the second flip-flop 62 is connected in signal communication with one of the two inputs of the NAND gate 64 by line 80.

It should be noted that both the first and second flip-flops have their reset inputs connected to line 54 which, in turn, is connected to the clock 18. Therefore, the falling edge of each clock pulse causes both flip-flops to reset.

The NAND gate 64 provides a logically high output on line 34 at all times when the signals on line 74 and 80 are not both logically high. When the signals on line 74 and 80 are both logically high, a logically low CIN signal is provided on line 34. As will be described in greater detail below in conjunction with FIGS. 3 and 4, an out-of-lock event is identified by a logically low CIN pulse on line 34 and represents an occurrence in which a lead signal on line 22 is not followed by a lag signal on line 30. Therefore, a continuous logically high CIN signal on line 34 represents the fact that n out-of-lock event has occurred.

Figure 3:
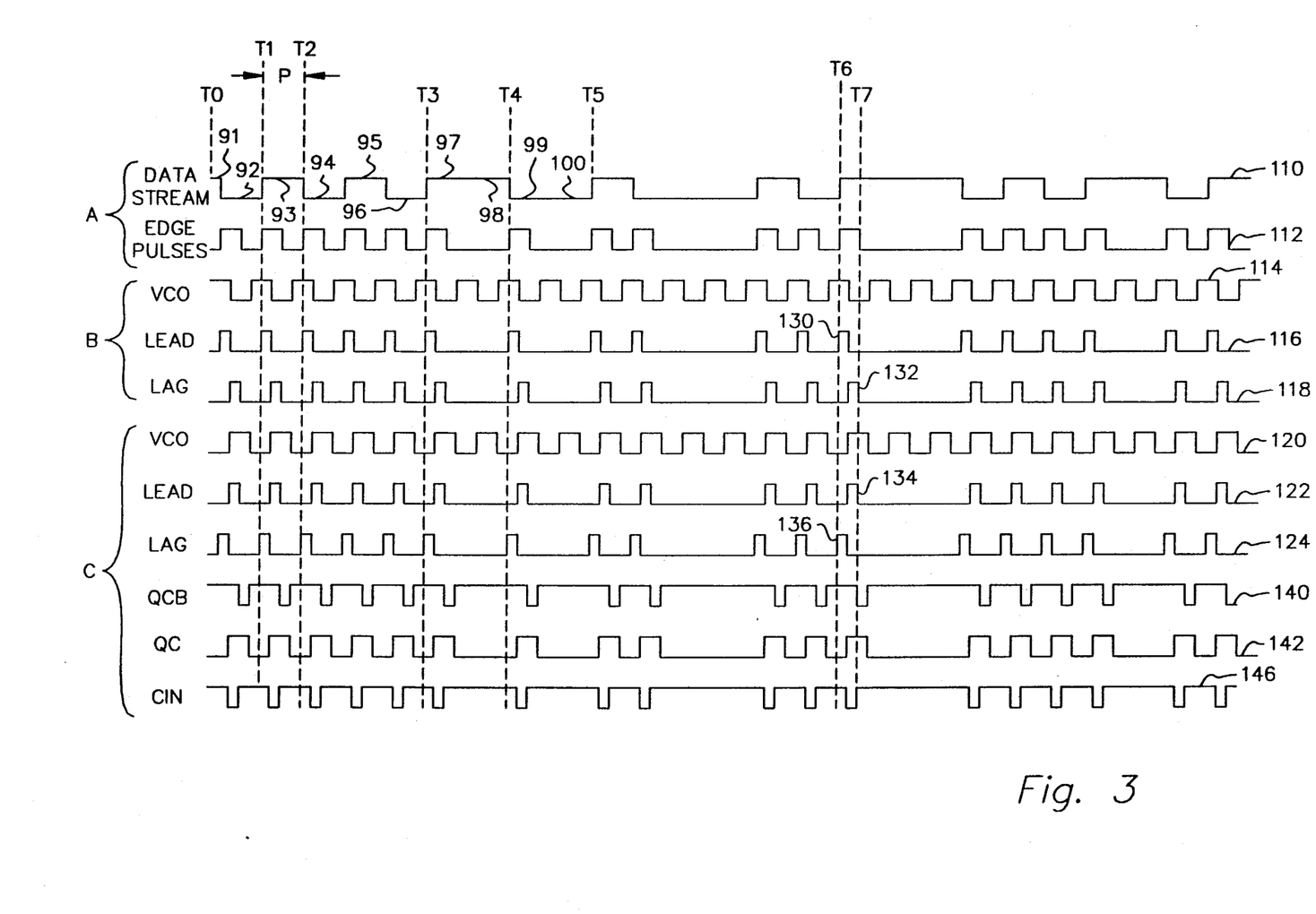
FIG. 3 shows two examples of timing diagrams illustrating the operation of the present invention in response to an in lock condition and a phase related out-of-lock condition.

FIG. 3 illustrates several timing diagrams which show the relationship between the pulses of the various signals described above. For example, the top timing diagram represents a typical NRZ data stream that could exist on line 12 of FIG. 1. Directly below it, the edge pulses represent the results that would exist on line 16 as a result of the data signal conditioner 14 operating on the data stream of line 12. The same data and edge pulses will be used to discuss the operation of the present invention under three different and unique circumstances in order to describe the present invention and explain how it reacts to those circumstances. In the nonreturn to zero, or NRZ, data stream shown at the top of FIG. 3, the period of the data pulses is identified by reference letter P shown between time T1 and time T2. Although the first six pulses, identified by reference numerals 91–96 in FIG. 3, represent alternating logical values between time T0 and time T3, it should be understood that many different combinations of sequential logical ones or logical zeros are likely to occur in the data stream during the typical transmission of a message on line 12 in FIG. 1. For example, between time T3 and T4, two logically high pulses, 97 and 98, occur and are followed by two logically low pulses, 99 and 100, between time T4 and T5.

The second timing diagram from the top of FIG. 3 represents the edge pulses that are provided on line 16 by the data signal conditioner 14. Each logic level change in the data stream identified by reference numeral 110 in FIG. 3 causes the data signal conditioner 14 to generate a logically high edge pulse for one half bit time and return to zero. This data signal conditioner 14 converts the NRZ data stream to a series of RZ edge pulses which has a logically high pulse for one half the NRZ bit time for each transition of the NRZ data stream. These conditioned edge pulses are identified by reference numeral 112 in FIG. 3. The data stream 110 and the edge pulses 112 are grouped together by bracket A because the same timing diagrams shown in FIG. 3 for these two streams, 110 and 112, will be used to show two different circumstances as examples of the operation of the present invention in FIG. 3. One of the circumstances is illustrated by the three timing diagrams within bracket B and the other circumstance is represented by the six timing diagrams identified by bracket C in FIG. 3. The same two timing diagrams, 110 and 112, will also be used in FIG. 4 to describe another circumstance under which the present invention can operate.

With reference to bracket B in FIG. 3, it can be seen that a voltage controlled oscillator, or VCO, signal, such as the clock signal that which would exist on line 12, is identified by reference numeral 114. The VCO signal represents the expected frequency and phase condition of a timing signal within a receiver apparatus. The purpose of the present invention is to determine whether or not the timing signal VCO is in synchronous frequency and the desired quadrature phase relation with the edge pulses 112. To accomplish this purpose, the lead signal 116 is provided on line 22 by the lead signal provider 20, which is alternatively referred to as a second means for providing a second series of pulses. A lag signal, which is identified by reference numeral 118 in FIG. 3, is provided on line 30 by the lag signal provider 28. If each lead signal is sequentially followed by a corresponding lag signal, the sequence comparator 6 generates no logically low CIN pulses on line 34 to indicate an out-of-lock event. By comparing the lead pulses and lag pulses within bracket B in FIG. 3, it can be seen that each lag pulse follows a lead pulse without exception. This relationship is on that indicates a proper frequency and phase lock condition between the edge pulses 112 and the clock pulses 114.

With continued reference to bracket B in FIG. 3, it should be understood that the CIN signal on line 34 is constantly high even though this signal is not illustrated in bracket B. Because the lead signals always proceed the lag signals in the above example, relating to bracket B, the QCB and QC signals are never logically high at the same time and, therefore, the output of NAND gate 64 is never logically low. The status of the CIN signal, if shown in bracket B of FIG. 3, would be a straight line at a logically high level for the duration of the example illustrated in FIG. 3.

With reference to bracket C in FIG. 3, the VCO pulses identified by reference numeral 120 are 180 degrees out of phase with those identified by reference numeral 114. Therefore, bracket C represents a series of timing diagrams that would occur if a phase related out-of-lock condition existed between the edge pulses 112 and the clock pulses 120. Following the logic dictated by the components illustrated in FIG. 2 with relation to the lead signal provider 20 and the lag signal provider 28, the lead pulses would occur at the timing positions represented by timing diagram 122 and the lag pulses would occur as illustrated by timing diagram 124. As can be seen in FIG. 3, the lag pulses occur before the lead pulses rather than visa-versa. It should be noted that, since both the lead and lag pulses require a logically high signal from the data signal conditioner, on line 16, both the lead and lag signals occur simultaneous with a logically high condition of the edge pulses 112. This can clearly be seen between times T6 and T7 in FIG. 3. With reference to timing diagrams 116 and 118, the lead pulse 130 and lag pulse 132 share the time between lines T6 and T7. This also occurs in bracket C as shown by timing diagrams 122 and 124. Lead pulse 134 and lag pulse 136 share the time between lines T6 and T7. However, by comparing timing diagrams 116 and 118 with timing diagrams 122 and 124, it can be seen that the sequential relationship between the lead pulses and the lag pulses have reversed. This reversal in the relationship between the lead and lag pulses indicates that an out-of-lock event of at least 90 degrees has occurred.

With reference to both FIGS. 2 and 3, it can be seen that the operation of the flip-flops in FIG. 2 will result in the creation of signal QCB on line 74 and signal QC on line 80. Because of the operation of the flip-flops, 60 and 62, the QCB and QC signals identified by timing diagrams 140 and 142 are provided as inputs to the NAND gate 64. With inputs such as those represented by signals QCB and QC in bracket C of FIG. 3, a series of logically low CIN output results on line 34 because of the normal action of the NAND gate 64. Signals QCB, QC and CIN are not shown in bracket B of FIG. 3, since the in-lock condition generates only a constant logically high CIN signal.

In bracket C of FIG. 3, the output signal CIN on line 34 is shown by timing diagram 146. Each logically low pulse of signal CIN represents an out-of-lock event between the edge pulses 112 and the VCO clock pulses 120. These out-of-lock events are reported to other circuitry by the logically low signal provided on line 34 by the sequence comparator 26 of the present invention.

With reference to bracket C in FIG. 3, it can be seen that a clock signal 120 of the precisely correct frequency can still generate out-of-lock signals CIN because of the phase related out-of-lock condition between the data pulses 112 and the clock signal 120. When the edge pulses 112 and the clock 114, or VCO, are in-lock, the CIN output remains constantly high.

Figure 4:
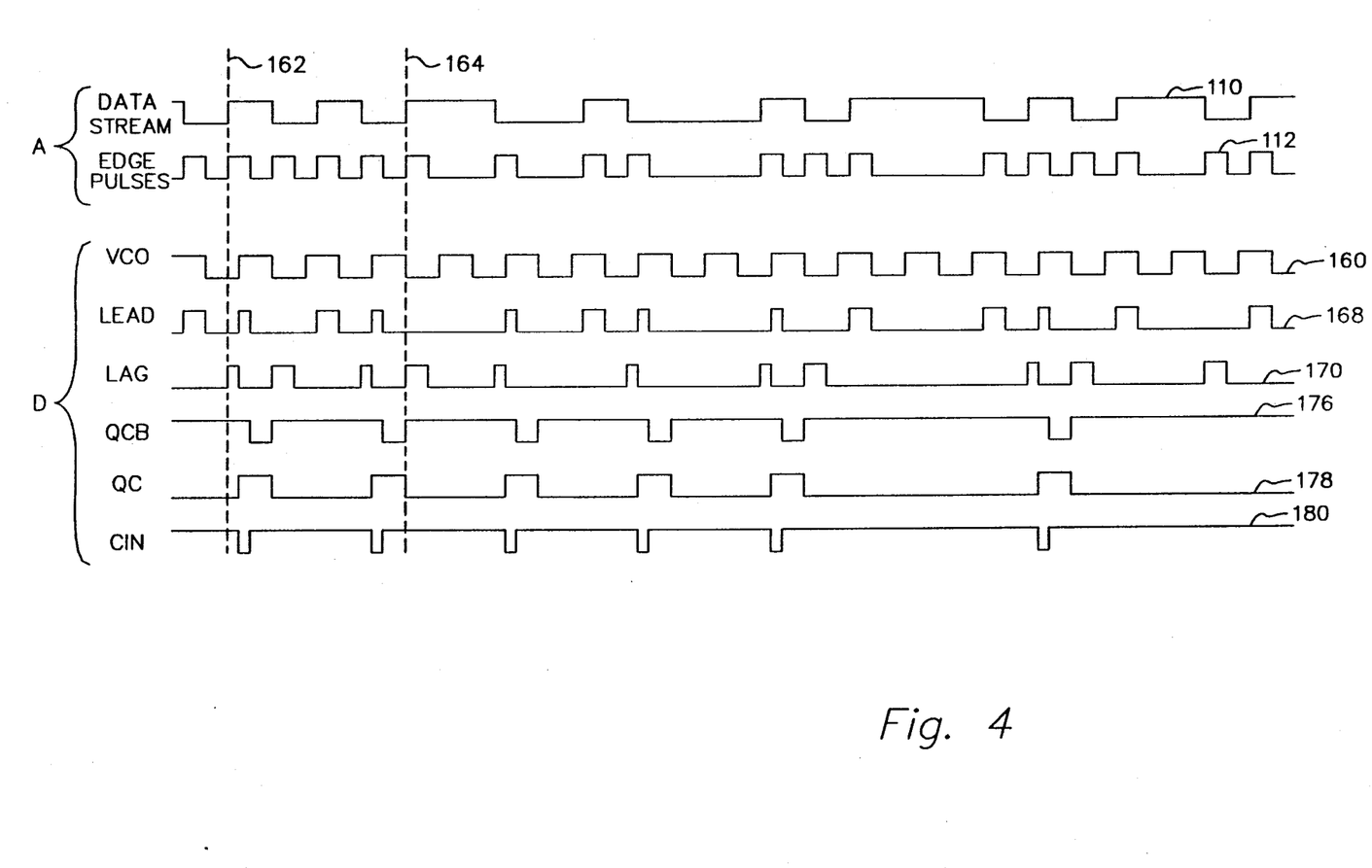
FIG. 4 illustrates a timing diagram which shows the operation of the present invention in a situation where a frequency related out-of-lock condition exists.

With reference to FIG. 4, the pulse stream and data pulses illustrated by bracket A in FIG. 4 are identically the same as those represented by bracket A in FIG. 3. The same data stream and edge pulses will be used to illustrate the following example which is intended to show the results of the present invention when a clock pulse differs in frequency from the edge pulses. To illustrate the difference in frequency between the edge pulses 112 and the clock pulses 160, dashed lines 162 and 164 are provided. As can be seen in FIG. 4, eight edge pulses occur between lines 162 and 164 with alternating pulses being logically high and logically low. During the same period of time, slightly more than five VCO clock pulses 160 occur. Therefore, the frequency of the VCO signal 160 differs from the frequency of the data pulses 112. That difference in frequency will be used to illustrate the reaction of the present invention to a frequency discrepancy or deviation between the clock pulses and the edge pulses. With reference to FIGS. 2 and 4, it can be seen that the lead pulses 168 and lag pulses 170 will be generated as a normal result of the operation of the lead signal provider 120 and the lag signal provider 128. The QCB signal, on line 74, is identified by reference numeral 176 in FIG. 4 and the QC signal, on line 80, is identified by reference numeral 178. As described above, the QCB and QC signals are generated by the action of the flip-flops, 60 and 62, in response to the clock input pulses received by those flip-flops on lines 22 and 30. With inputs provided by signals QCB and QC, the NAND gate 64 in FIG. 2 provides an output CIN signal on line 34, as illustrated by reference numeral 180 in FIG. 4. The existence of logically low pulses on the CIN timing diagram 180 indicates that out-of-lock events have occurred. Therefore, the example in bracket D of FIG. 4 demonstrates that the present invention can identify frequency deviations between the clock signal 160 and the edge pulses 112.

It should be understood that the frequency of logically low pulses on line 34 of FIG. 2 is dependant not only on the outof-lock condition, but also on the frequency of rising or falling edges within the pulse stream 110 on line 12. If a long series of sequentially identical data bits occurs on line 12, the number of rising or falling edges will be significantly decreased and the speed of reaction of the present invention to out-of-lock events will be somewhat diminished. However, this feature is advantageous in an NRZ data stream because it only generates out of lock signals at the edges of the NRZ pulses and not when the data stream stays in the same state.

In a typical application of any out-of-lock detector, it is helpful to determine the severity of the out-of-lock condition. For example, minor variations in signal frequency or phase need not always cause a change in the frequency or phase of the VCO clock signal. In addition, short term noise pulses can cause spurious, but short lived, apparent deviations to occur. Therefore, some small acceptable magnitude of out-of-lock condition can be determined to be insignificant and not requiring a change in frequency or phase of the clock signal. To easily facilitate this provision of a threshold magnitude of this apparent out-of-lock condition, the present invention provides the CIN signal on line 34 to a counter arrangement that is programmable.

Figure 5:
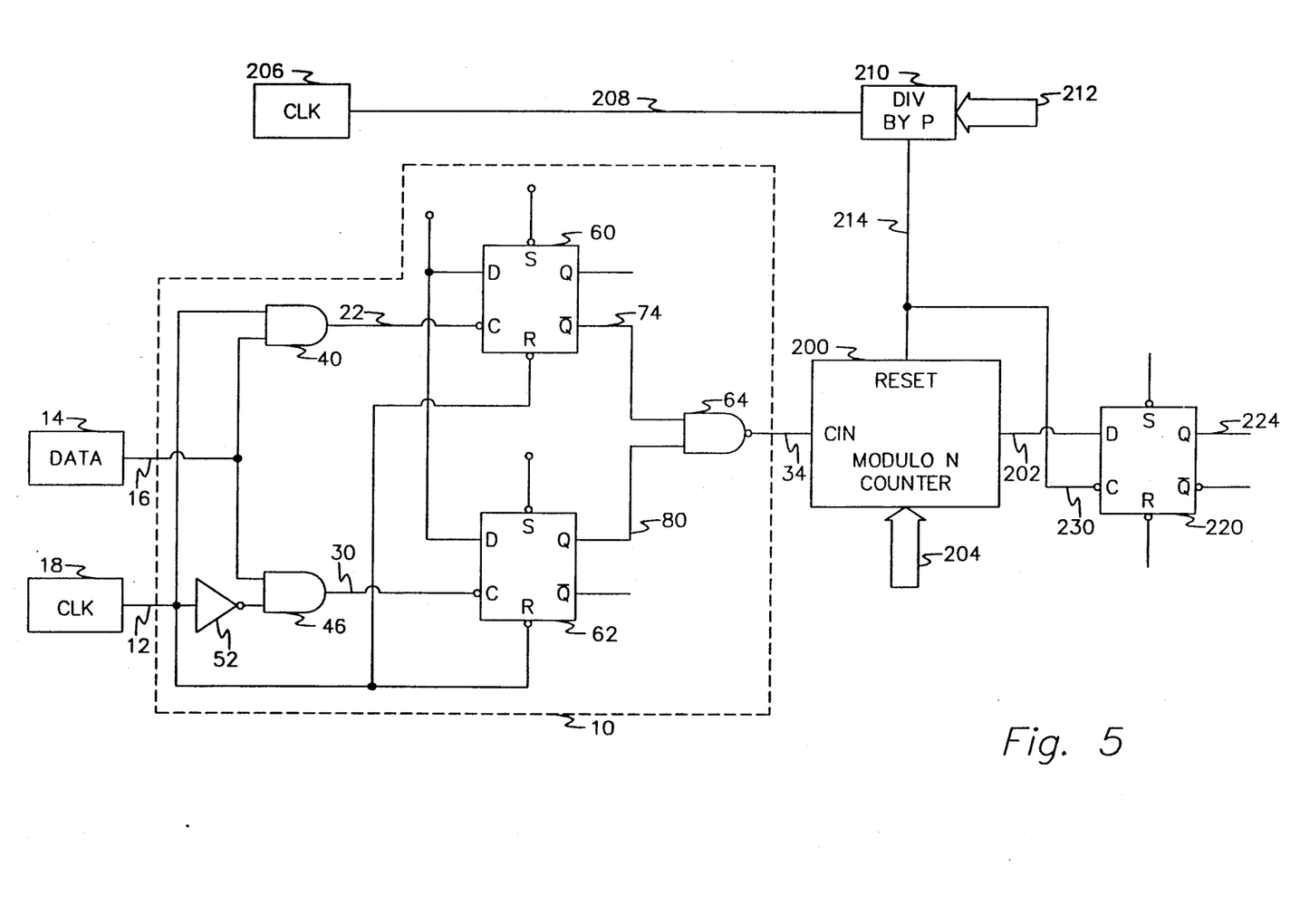
FIG. 5 shows the present invention arranged in association with a counter to provide a programmable out-of-lock detector.

FIG. 5 illustrates the present invention 10 connected in association with the data conditioner 14 and clock 18. In addition to the components described above in relation to FIGS. 1 and 2, FIG. 5 also shows a counter 200 which provides an output on line 202 whenever the number of logically low pulses on line 34 exceeds the number N. The magnitude of integer N is programmable and can be provided as the data input identified by reference numeral 204 in FIG. 5. Also shown in FIG. 5, another clock 206 is used to provide a stream of timing pulses on line 208. The frequency of timing pulses on line 208 is sufficiently high to provide a plurality of pulses for every possible pulse on line 34. This high frequency signal is provided to a divider 210 which divides the number of pulses on line 208 by a magnitude P which is, in turn, programmable. The entry of a value for P is represented by arrow 212 in FIG. 5. As illustrated in FIG. 5, a signal pulse occurs on line 214 whenever the number of pulses on line 208 exceeds the magnitude of P. A signal pulse on line 214 performs two functions. First, it clocks the value on line 202 into the Q output of flip-flop 220. The Q output, identified by reference numeral 224, represents the occurrence of an out-of-lock condition sufficient to exceed a given number N of out-of-lock events within a time period defined by P pulses from clock 206. Beside clocking the data on line 202 to the Q output 224 of flip-flop 220 by providing a signal on line 230, a signal on line 214 also resets the counter 220 to begin a new period during which logically low pulses on line 34 will be counted.

With continued reference to FIG. 5, it can be seen that the present invention 10 provides a signal on line 34 which can be incorporated into a system which counts the number of signals on line 34 within a predefined time period determined by the frequency of clock 206 and the programmable value P in the divider 210 to determine the number of pulses received on line 34 during the time period. If the number of pulses received on line 34 exceeds a programmable number N, a signal on line 202 is provided and the value on line 202 is clocked into flip-flop 220 by a signal on line 230 provided by the divider 210. An output signal on the Q output of flip-flop 220, as a result of the clocking caused by the signal on line 230, provides an out-of-lock signal on line 224. The signal on line 224 indicates that the data being monitored by the present invention is actually in an out-of-lock condition because a sufficient number out-of-lock events have occurred during a predetermined period of time. In a typical phase locked loop, or PLL, circuit, the out-of-lock condition signal on line 224 would be used to represent the need for some corrective action to be taken to allow the phase locked loop to achieve a locked state.

Although the present invention has been described with significant specificity and a most preferred embodiment of the present invention has been illustrated with particular detail, it should be understood that alternative embodiments of the present invention are within its scope.

The embodiments of the invention in which an exclusive property or right is claimed are defined as follows:

1. An apparatus for detecting a deviation of a data signal from another signal of a predefined frequency, comprising:
   first means for providing a first series of pulses at said predefined frequency;
   second means for providing a second series of pulses, each of said second series of pulses being indicative of a first relationship between each of said first series of pulses and a coincident pulse of said data signal, said second providing means being connected in signal communication with said first providing means;
   third means for providing a third series of pulses, each of said third series of pulses being indicative of a second relationship between each of said first series of pulses and said coincident pulse of said data signal, said third providing means being connected in signal communication with said first providing means;

means for determining the sequential relationship between each of said second series of pulses and a sequentially related pulse of said third series of pulses, said determining means being connected in signal communication with said second and third providing means;

fourth means for providing an output signal representing said sequential relationship;

means for defining a time period having a predefined length; and means for counting changes in magnitude of said output signal during said time period, said counting means being connected in signal communicating with said fourth providing means.

2. The apparatus of claim 1, further comprising:

fifth means, connected in signal communication with said fourth providing means, for providing a frequency status signal when said changes in magnitude exceed a predefined number.

3. The apparatus of claim 1, wherein:

said second providing means comprises a first AND gate having said data signal and said first series of pulses as its inputs.

4. The apparatus of claim 3, wherein:

said third providing means comprises a second AND gate having said data signal and an inversion of said first series of pulses as its inputs.

5. The apparatus of claim 4, wherein:

said determining means comprises a first FLIP-FLOP with its clock input connected to an output of said first AND gate.

6. The apparatus of claim 5, wherein:

said determining means comprises a second FLIP-FLOP with its clock input connected to an output of said second AND gate.

7. The apparatus of claim 6, wherein:

said first and second FLIP-FLOPs have their reset inputs connected to said first means for providing said first series of pulses.

8. The apparatus of claim 7, wherein:

said determining means comprises a NAND gate having its inputs connected to outputs of said first and second FLIP-FLOPs.

9. An apparatus for detecting frequency deviation of a data signal from a predefined frequency, comprising:

a first pulse generator for producing a first series of pulses at said predefined frequency;

a first circuit connected to said first pulse generator for providing a lead pulse representative of a first relationship between each of said first series of pulses and a coincident pulse of said data signal;

a second circuit connected to said first pulse generator for providing a lag pulse representative of a second relationship between each of said first series of pulses and a coincident pulse of said data signal;

a comparator circuit connected to said first and second circuits for determining the sequential relationship between said lead and lag pulses, said comparator circuit having an output signal representative of said sequential relationship, said output signal being representative of the frequency deviation of said data signal from said predefined frequency; and means for counting changes in magnitude of said output signal over a preselected period of time, said counting means being connected to said comparator circuit.

10. The apparatus of claim 9, wherein:

said first circuit comprises a first AND gate having inputs connected to said data signal and an output of said first pulse generator.

11. The apparatus of claim 10, wherein:

said second circuit comprises a second AND gate having inputs connected to said data signal and an inverted output of said first pulse generator.

12. The apparatus of claim 11, wherein:

said comparator circuit comprises a first FLIP-FLOP having its clock input connected to the output of said first AND gate, a second FLIP-FLOP having its clock input connected to the output of said second AND gate and a NAND gate having its inputs connected to outputs of said first FLIP-FLOP and said second FLIP-FLOP.

13. A method for detecting frequency deviation of a data signal from a predefined frequency, comprising:

providing a first series of pulses at said predefined frequency;

providing a second series of pulses, each of said second series of pulses being indicative of a first relationship between each of said first series of pulses and a coincident pulse of said data signal;

providing a third series of pulses, each of said third series of pulses being indicative of a second relationship between each of said first series of pulses and said coincident pulse of said data signal;

determining the sequential relationship between each of said second series of pulses and a sequentially related pulse of said third series of pulses;

providing an output signal representing said sequential relationship; and counting changes in magnitude of said output signal over a preselected time period.

14. The method of claim 13, further comprising:

providing a frequency status signal when said changes in magnitude exceed a predefined number during said time period.

* * * * *